United States Patent [19]

Sato

[11] 4,350,918

[45] Sep. 21, 1982

[54] CONTOUR VIBRATION MODE PIEZOELECTRIC RESONATOR

[75] Inventor: Hirochika Sato, Tokyo, Japan

[73] Assignee: Kabushiki Kaisha Daini Seikosha, Japan

[21] Appl. No.: 87,751

[22] Filed: Oct. 24, 1979

[30] Foreign Application Priority Data

Dec. 21, 1978 [JP] Japan .................................. 53-160737
Dec. 22, 1978 [JP] Japan .................................. 53-160571

[51] Int. Cl.³ .......................................... H01L 41/08
[52] U.S. Cl. .................................... 310/367; 310/368;
310/320; 310/361; 310/344; 310/348; 310/351
[58] Field of Search ................................ 310/367–369,
310/360, 361, 320

[56] References Cited

U.S. PATENT DOCUMENTS

| | | | |
|---|---|---|---|
| 3,828,210 | 8/1974 | Livenick | 310/346 |
| 4,035,674 | 7/1977 | Oguchi et al. | 310/367 |
| 4,139,793 | 2/1979 | Michel | 310/367 X |
| 4,216,402 | 8/1980 | Engdahl | 310/353 X |

FOREIGN PATENT DOCUMENTS

| | | | |
|---|---|---|---|
| 52-27394 | 3/1977 | Japan | 310/353 |
| 52-53689 | 4/1977 | Japan | 310/353 |
| 52-53690 | 4/1977 | Japan | 310/367 |
| 52-57794 | 5/1977 | Japan | 310/367 |

*Primary Examiner*—Mark O. Budd
*Attorney, Agent, or Firm*—Robert E. Burns; Emmanuel J. Lobato; Bruce L. Adams

[57] ABSTRACT

A contour vibration mode piezoelectric resonator has a vibrating portion and at least one supporting portion integrally connected to the vibrating portion by way of a bridge portion. The supporting portion comprises a resilient portion directly connected to the vibrating portion, an attenuation portion integrally connected to the resilient portion and which is insubstantially displaced by vibration during use and a fixing portion fixable on a supporting member and which is either integrally connected to or forms a part of the attenuation portion.

24 Claims, 36 Drawing Figures

F I G. 10(b)     F I G. 10(c)
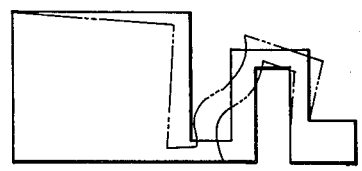 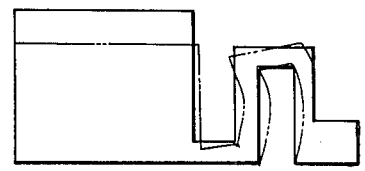
F I G. 11(a)     F I G. 11(b)
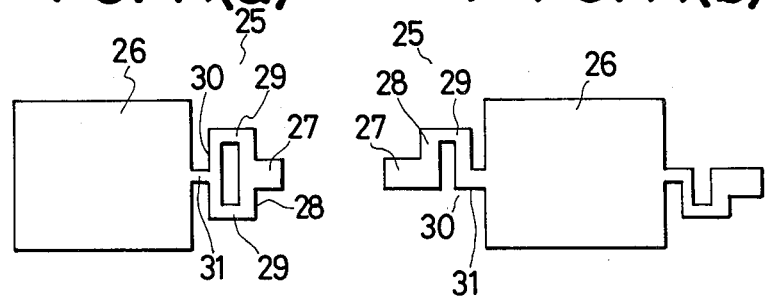
F I G. 11(c)     F I G. 11(d)
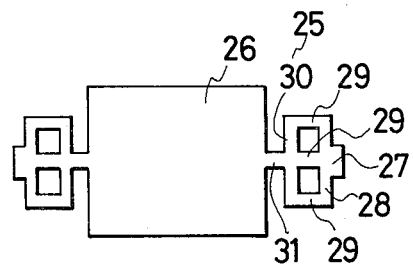 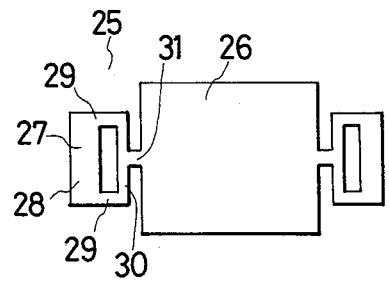

FIG. 12
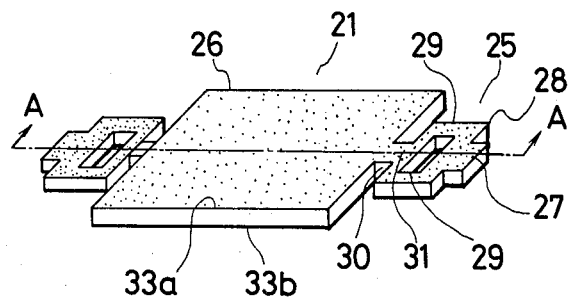
FIG. 13
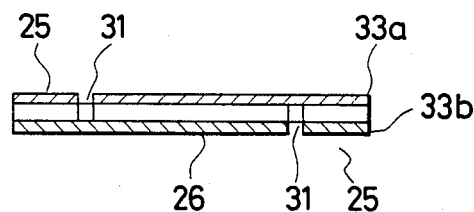
FIG. 14  FIG. 15
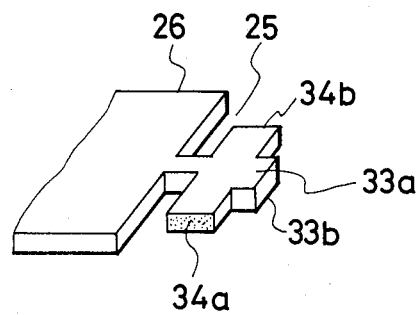
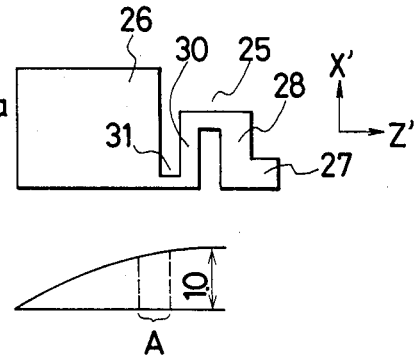

F I G. 16    F I G. 17
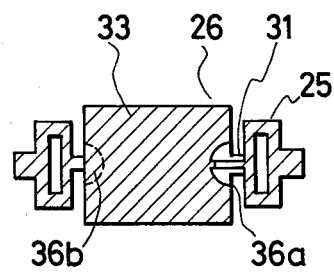
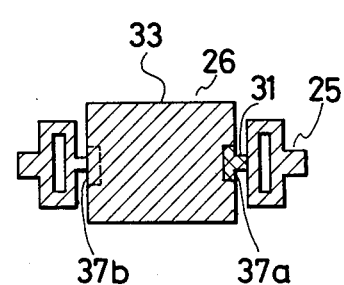
F I G. 18
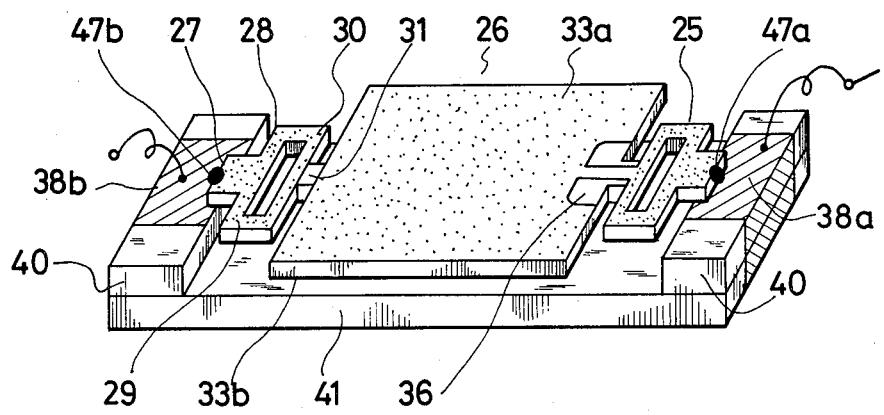

F I G. 19
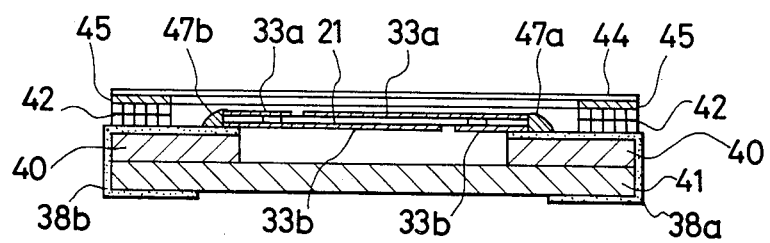
F I G. 21
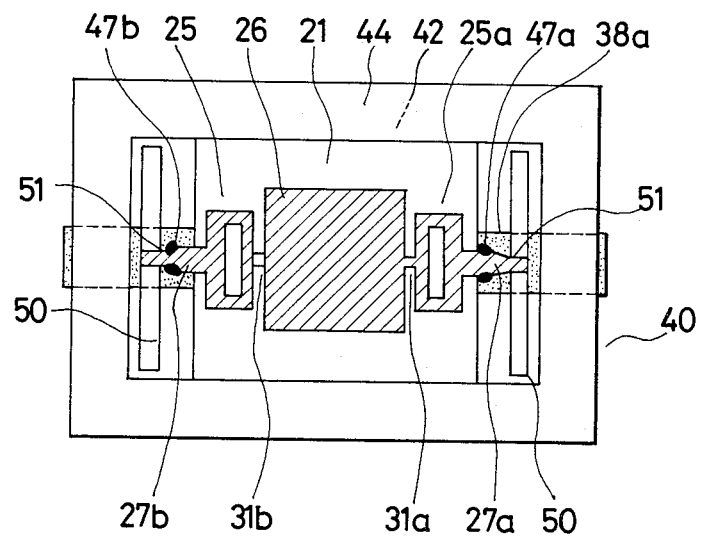

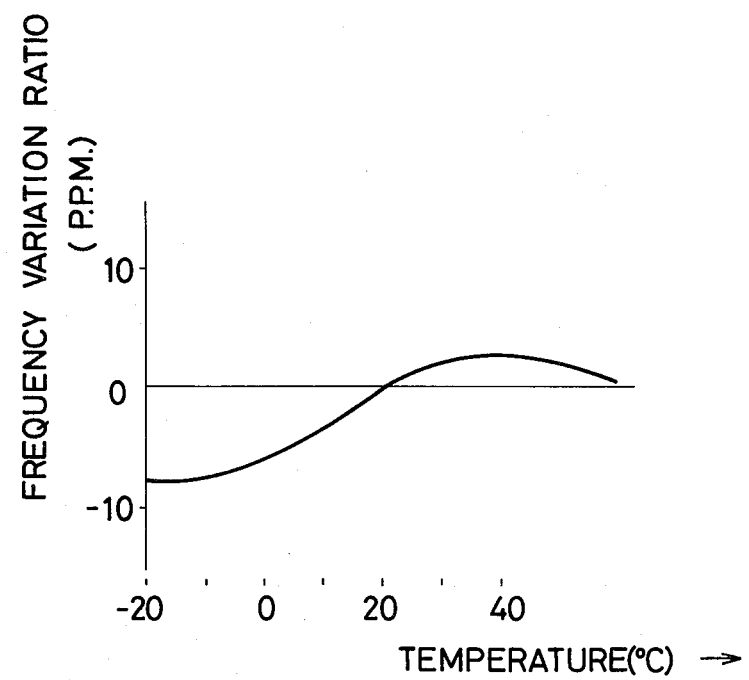
F I G. 20

F I G. 24
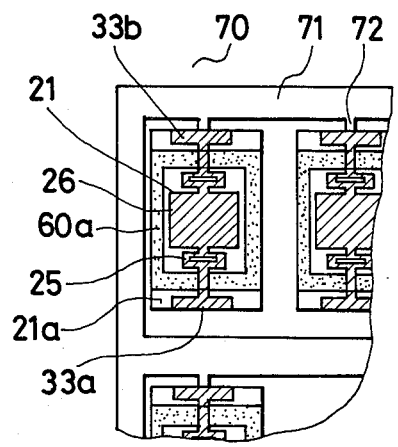
F I G. 25
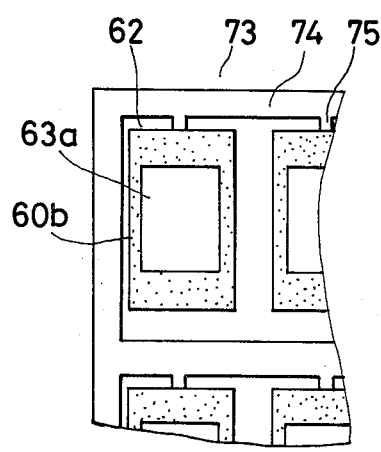
F I G. 26
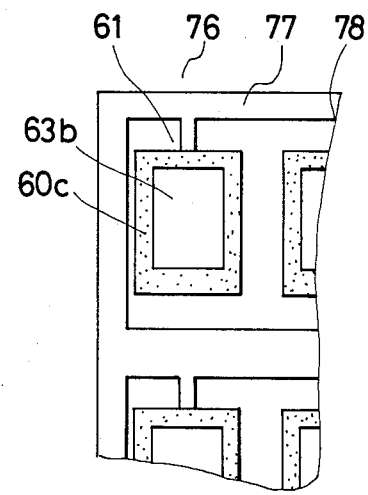

CONTOUR VIBRATION MODE PIEZOELECTRIC RESONATOR

BACKGROUND OF THE INVENTION

The present invention relates to a contour vibration mode miniature quartz resonator, and more particularly to the cut angle, dimension, shape and electrode construction thereof.

It is an object of the present invention to miniaturize the resonator, to reduce the CI (crystal impedance), and to improve the frequency-temperature characteristics by suitably combining the cut angle, dimension, shape and electrode construction of the contour vibration mode quartz resonator.

It is another object of the present invention to provide a contour vibration mode miniature quartz resonator to be easily assembled.

Recently, electronization of a wrist watch has been advanced and particularly a quartz wrist watch incorporating a tuning fork type flexural quartz resonator as a frequency standard bus been put into a practical use. The frequency-temperature characteristics of the tuning fork type flexural quartz resonator is shown by a quadratic curve, and it is difficult to relize highly precise and stable frequency in a wide temperature range. Therefore, titanium acid barium condenser, the capacitance of which varies according to temperature, is employed for temperature compensation to thereby put the considerably high precision quartz wrist watch into a practical use. In this case, however, the precision of the quartz wrist watch is limited since the temperature compensation condenser should be adjusted to the temperature characteristic of the quartz resonator at the optimum value, and the capacitance of the temperature compensation condenser charges with the passage of time.

Therefore, an AT-cut quartz crystal wrist watch having a cubic frequency-temperature curve have been drawn an attention in order to improve the above mentioned disadvantages. As for the AT-cut quartz resonator, however, there are many spurious vibrations other than the thickness shear vibration used for the frequency standard, and the spurious vibrations injuriously affect on the various characteristics of the resonator. Accordingly, in order to separate the spurious vibrations from the major vibration (thickness shear vibration), the optimum dimension and the cut angle of the quartz crysal plate should be selected and exceedingly high precision is required. But the above requirements have not been achieved at present stage in the industrial view with respect to number of man-hour, yield and the like. Particularly, it is difficult to meet this requirement in the case of a miniature AT-cut quartz resonator for use in a wrist watch. Further, the supporting method which prevents a change of the spurious vibrations caused by support of the quartz resonator and a deterioration of the CI and ensures sufficient shock resistance have not been proposed.

By the above mentioned various problems, the wrist watch incorporating therein the AT-cut quartz resonator as the frequency standard has scarcely been put into a market.

On the other hand, a GT-cut quartz resonator has also the cubic frequency-temperature curve, other than the AT-cut quartz resonator. The GT-cut resonator is scarcely used at present though it is conventionally used, but has never been used for a wrist watch.

For instance, the conventional GT-cut quartz crystal plate having the standard frequency of 100 KHz is considerably large in size, i.e., the long side, the short side and the thickness thereof are respectively 38.4, 32.9 and 3(mm), and further, since the cut angle of the GT-cut resonator is specific, the large rough stone is necessary and resultantly a cost of the GT-cut quartz crystal plate is very expensive. Moreover, since the GT-cut quartz crystal plate is large in size, the quartz crystal plate should have been supported by so called multi-points supporting method, i.e., the method to connect from 4 to 8 supporting wires fixed on from 2 to 4 portions (totaled 4 to 8 portions) on both surfaces on the nodal points of the quartz crystal plate taking the strength into account. Moreover, the solder balls are provided on the supporting wires at the positions where the leakage of vibration energy of the resonator is at minimum.

The multi-points supporting method will be shown in FIG. 1. As shown in FIG. 1, a quartz crystal plate 1 is supported by fixing one ends of supporting wires 2 such as headed wires and the like vertically and connecting the other ends of the supporting wires to supporting poles 3. Namely, silver points are fixed to the supporting positions of the quartz crystal plate 1 by burning and then the supporting wires 2 are vertically fixed to the silver points by providing conical solders 5a. The other ends of the supporting wires 2 are fixed to a substrate 6 and fixed to the supporting poles 3 being conductive to the external circuits by solders 5b. The supporting wires 2 should be adjustes so that the peaks of the conical solders 5a serve as nodes of vibration under the vibration frequency. Accordingly positions of solder balls 4 are adjusted in condition of FIG. 1 so that the peak of the conical solders serve as nodes of vibration of the supporting wires. This subtle and difficult process should be taken for all the supporting wires 2. Further, the elimination of the dimension of the GT-cut quartz resonator in the thickness direction is limited since there is a possibility that the conical solders are welded when the positions of the solder balls are adjusted, and thereby the excessive space is occupied. By way of an improvement of FIG. 1, a miniature GT-cut resonator having the long side, the short side and the thickness thereof respectively 8.03, 9.37 and 0.65(mm) is used to thereby reduce the number of the supporting wires.

The embodiment that the supporting wires of the quartz crystal plate is reduced will be shown in FIG. 2.

The method shown in FIG. 2 is completely the same as the method shown in FIG. 1 and each of the supporting wires 2 are fixed to the center of both surfaces of the quartz crystal plate 1. In this method even, though the number of the supporting wires is smaller than that of FIG. 1 and the adjustment of the solder balls have been simplified, the total occupied space has been reduced.

As illustrated above, the conventional supporting wire method of the quartz resonator as shown in FIGS. 1 and 2 has the following disadvantages; (1) the assembling process of the quartz resonator is troublesome and yield thereof is not good, (2) sufficiently large space is required, whereby the quartz resonator assembled by this supporting wire method could have never been applied to the wrist watches, since requirement of the quartz resonator incorporated into a wrist watch is the mass productivity and miniature size.

In order to improve upon the disadvantages of the supporting wire method, the vibrating portion and the supporting portion of the quartz resonator can be made in one piece as shown in FIG. 3. Namely the quartz crystal plate is easily supported and miniaturized by providing the supporting portion near the nodal line of the vibrating portion. In FIG. 3 a vibrating portion 11 and a supporting portion 12 are made in one piece by etching from a GT-plate. The long side, the short side and the thickness of the vibrating portion 11 are respectively 4.9, 4.2 and 0.04 (unit: mm) and the frequency thereof is 780 KHz. The supporting portion 12 is connected with the vibrating portion 11 near a nodal line 15 and fixed on the supporting member (not shown) at a portion 12 indicated by oblique lines. Simultaneously an electrode film 13a on the obverse surface and the electrode film 13b on the reverse surface of the vibrating portion 11 are conducted with the external circuit. Though this method is advantageous to the supporting wire method of FIGS. 1 and 2 with respect to a simple process and mass productivity, there is a room to miniaturize the supporting portion.

Namely, though the quartz crystal plate shown in FIG. 3 can be miniaturized than the quartz crystal plate shown in FIGS. 1 and 2, an excessive space is needed because of large supporting portion, whereby the quartz crystal plate shown in FIG. 3 is not suitable for use in a wrist watch. Further, since the vibration energy of the vibrating portion is transmitted to the supporting member even if the dimension and shape of the supporting portion is optimum, the leakage of vibration occurs and as a result, increase in CI, deterioration of pressure resistance and despersion in the frequency-temperature characteristics come out. On the other hand, the condition of the resilience coupling of the long side vibration and the short side vibration which controls controls characteristics of the GT-plate changes by the provision of the supporting portions, and as a result the characteristics of the quartz resonator change.

BRIEF DESCRIPTION OF THE DRAWINGS

FIGS. 12 and 13 show another embodiments of the resonator according to the present invention, FIG. 14 is an embodiment showing an improvement of the resonator according to the present invention, FIG. 15 shows a distribution of displacement of the resonator according to the present invention, FIGS. 16 and 17 show another embodiment of the resonator according to the present invention, FIG. 18 is a perspective view showing the resonator used in the experiment according to the present invention, FIG. 19 is a sectional view showing the supporting method of the piezo electric resonator according to the present invention shown in FIG. 18 more concretely, FIG. 20 shows an experimental result of the frequency-temperature characteristics, FIG. 21 shows another embodiment of the supporting method of the piezo electric resonator according to the present invention, FIGS. 24, 25 and 26 show the manufacturing method of the piezo electric resonator and the capsule thereof according to the present invention.

DETAILED DESCRIPTION OF THE INVENTION

Hereafter the present invention will be illustrated in conjunction with the accompanied drawings using a quartz resonator.

Figure 4:
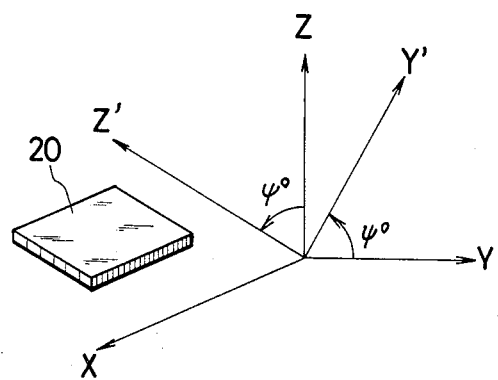
FIGS. 4 and 5 show the cut angles of the resonator according to the present invention.
Figure 5:
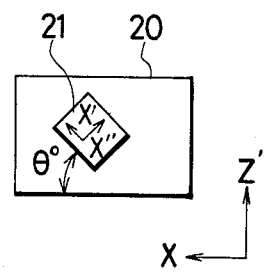

FIGS. 4 and 5 show the cut angle of the contour vibration mode quartz resonator according to the present invention, whose X-axis, Y-axis and Z-axis respectively denote electrical axis, mechanical axis and optical axis of the quartz crystal plate, and where '(prime) denotes that the resonator is rotated. A quartz crystal plate 20 rotating the Y-plate at $\psi=45°$ to 65° around the X-axis in FIG. 4 is rotated at $\theta=\pm(40°$ to 50°) inside the major surfaces (X-Z planes) in FIG. 5.

According to the vibration analysis in two dimensions, the following relations of each of the constituents of the elastic constant of the quartz crystal are represented as follows: (1) $C'11=C'33$, $C'15=C'35$ (2) $C'11$, $C'33$, $C'13=C'15$, $C'35$; where '(prime) denotes the value that the coordinate is transformed. Further, since $C'55$ is negligible taking the piezo electric constant into account, it is noted that the longitudinal vibration in the directions of the X'-axis and the Z"-axis are excited in the case that the plate thickness is sufficiently thin. Consequently the feature of the resonator is effected by the elastic constant of two longitudinal vibrations and the above mentioned relations will be shown in FIG. 6.

Figure 6:
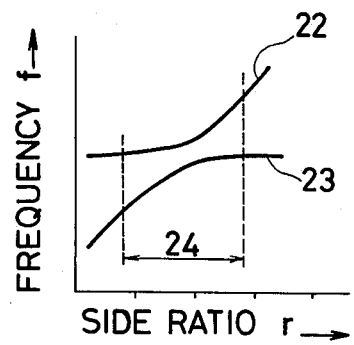
FIG. 6 shows the relation between the side ratio and the frequency of the resontor according to the present invention, FIGS. 7 (a), (b) and (c) show the sample of the resonator according to the present invention.

In FIG. 6 the side ratio r denotes the dimentsional ratio of short side to long side, where the dimension of short side is constant and the dimension of long side is changed. FIG. 6 shows that short side vibration frequency 22 and long side vibration frequency 23 are coupled in a region 24 of a certain side raetio. The values $\psi=51.5°$, $\theta=45°$ and r=0.85 in FIGS. 4 to 6 are used for the conventional GT-cut quartz crystal plate. And when the frequency-temperature characteristics calculated by the frequence equation obtained by the vibration analysis is further calculated using $\psi$, $\theta$ and r as parameters, the excellent frequency-temperature characteristics are realized in a wide range of the parameter.

The above mentioned result is very important for the resonator consists of the vibrating portion and the supporting portions made in one piece by way of bridges. That is to say, since the value obtained by the theoretical calculation is in the case of free vibration, the boundary condition is different from the case of the resonator consist of the vibrating portion and the supporting portions made in one piece, whereby the values of parameters $\psi$, $\theta$ and r which give the excellent frequency-temperature characteristics shift. Taking the above fact into account, it is very convenient that the excellent frequency-temperature characteristics are realized in a wide temperature range. Further, even if the quartz resonator is miniature size, i.e., the short side of the vibrating portion is less than 5 mm, there is a possibility that the values of the parameter shift by a various causes. In this respect the above mentioned feature is advantageous.

The range of each of the parameters theoretically calculated by the above explanations are $\psi=40°$ to $70°$, $\theta=40°$ to $50°$ and $r=0.80$ to $1.00$.

Subsequently, the feature of the resonator having the supporting portions of various shapes as shown in FIGS. 7 (a), 7 (b) and 7 (c) manufactured by way of trial is experimented, and the following new facts are found.

Figure 2:
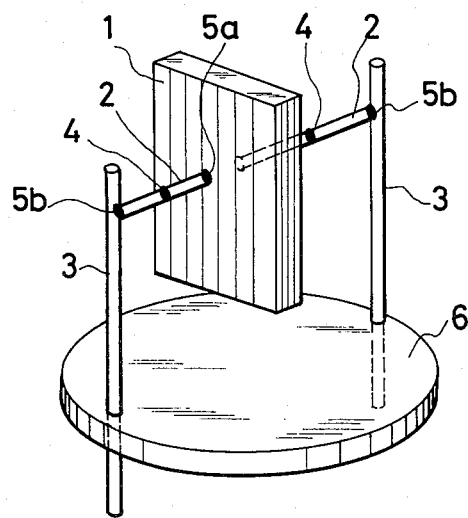
Figure 3:
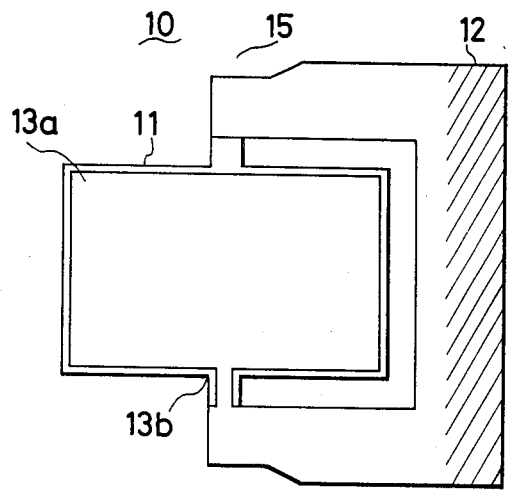
FIG. 3 is a plan view showing the conventional GT-cut quartz resonator comprising supporting portions and a vibrating portion made in one piece.

A resonator 21 consists of a supporting portion 25 and a vibrating portion 26 made in one piece. Though FIGS. 7 (a), 7 (b) and 7 (c) show the typical embodiments, it is to be noted that various kinds of supporting portions having various dimensions and shapes are used in the experiment. Further, the supporting method of FIG. 11 is the supporting wire method as shown in FIG. 2 to treat the effects by the supporting method equally. By combining each of the parameters, the quartz resonator having excellent frequency-temperature characteristics and low CI is realized when the following parameters are combined:

$\psi=45°$ to $65°$
$\theta=\pm(40°$ to $50°)$
$r=0.8$ to $1.00$

Speaking more in detail, since the effective constituent of the resonator according to the present invention is the electric field in the direction of Y-axis, the constituent becomes small if $\psi$ becomes large and the driving efficiency falls down. But when $\psi<65°$ the quartz resonator is not influenced by the electric field in the direction of Y-axis so much, and there is carcely a difference between the present embodiment and the conventional type with respect to CI. Though the resonator is mainly etched when the vibrating portion and the supporting portions are made in one piece, the quartz crystal has the property that Y-direction thereof is scarcely etched because of its anistropy, and it takes long time to etch the resonator when $\psi<45°$. (etching liquid is the mixture of fluorine acid and ammonium fluoride). The experiment teaches the optimum $\psi$ value as: $45°\leq\psi\leq65°$. Subsequently, with respect to $\theta$, $\theta$ is not necessarily $45°$ as mentioned before and the significant characteristic of the quartz resonator is not effected so much by $\theta$. The tolerance of $\theta$ is the same as the tolerance given by theoretical calculation: $40°\leq\theta\leq50°$. Lastly, with respect to the frequency-temperature characteristics, if the value r is in the range of 0.80 to 1.00 when $\psi$ and $\theta$ are in the above mentioned range, excellent frequency-temperature characteristics is obtained regardless of the dimensions and shapes of the supporting portions. ($r=W/L$ in FIGS. 7(a), 7(b) and 7(c)).

Figures 7A, 7B:
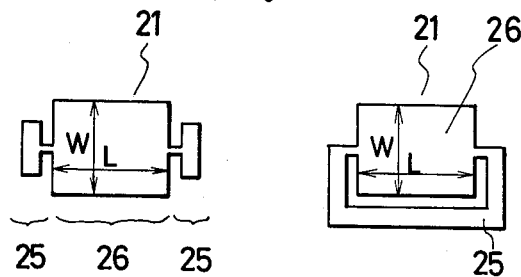
Figure 7C:
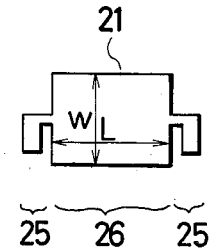

As mentioned above, each of the parameters ($\psi$, $\theta$, r) given by the experiment using the samples as shown in FIGS. 7(a), 7(b) and 7(c) are included in the range of the parameters given by the preceeding theoretical calculation. Consequently, the value of parameters according to the present invention is confirmed both experimentally and theoretically.

The data shown that resonators according to the present invention having various shapes of the supporting portions satisfies any specifications required, by combining each of the parameters suitably, whereby the resonator according to the present invention is freely designed.

Subsequently the embodiment of the contour vibration mode miniature quartz resonator using the parameters mentioned above will be illustrated.

Figure 8:
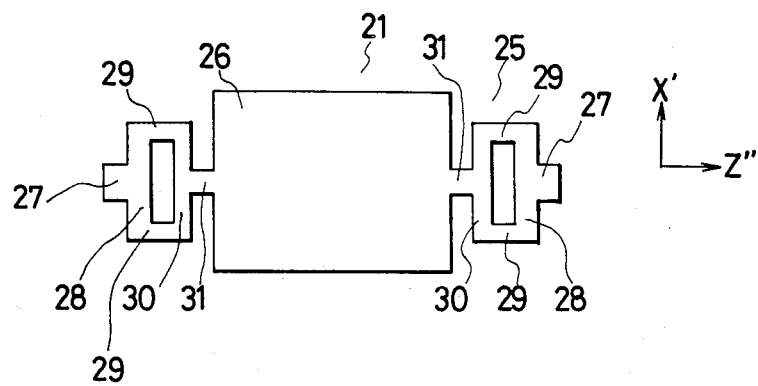
FIGS. 8 and 9 show embodiments of the resonator according to the present invention, FIGS. 10 (a), (b) and (c) show the principle of the resonator according to the present invention, FIGS. 11 (a), (b), (c) and (d) are respectively plan views showing another embodiments of the resonator according to the present invention.
Figure 9:
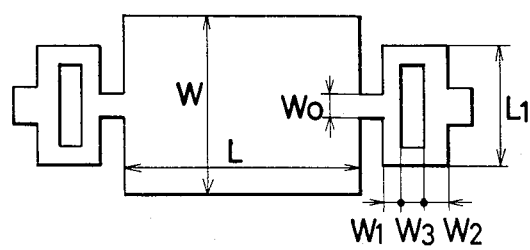

FIG. 8 shows an embodiment of the contour vibration mode miniature quartz resonator according to the present invention and FIG. 9 shows each of the dimensions of FIG. 8. A contour vibration mode quartz resonator 21 consists of a vibrating portion 26 and supporting portions 25 made in one piece by etching. Each of the parameters $\psi$, $\theta$ and r are within the range of the above mentioned parameter and suitably combined to improve the frequency-temperature characteristics.

The maximum width of the short side W of the resonator is less than 5 mm and the thickness thereof is less than 200 $\mu$m. The value of the thickness t is newly found experimentally and theoretically by the reason that the more the thickness of the resonator increases the more the etching ability and the frequency-temperature characteristics deteriorate by the tendency that the elastic coupling of the two longitudinal vibrations is hard to be developped. The supporting portions 25 comprise the resilient portions interlock with the vibration of the vibrating portion 26 by way of bridge portions 31, attenuation portions 28 connected to both ends of the resilient portions by connecting portions 29, and fixing portions 27 provided at the centers of the attenuation portions and fixed to supporting member and the like, and the width dimension of the bridge portions 31, the width dimension of the resilient portions, the width dimension of the attention portions, the distance between the resilient portions and the attenuation portions, and the length of the resilient portions are respectively, W0, W1, W2, W3 and L1.

The operating principle of the embodiments of FIGS. 8 and 9 will be illustrated in conjunction with FIG. 10.

Figure 10A:
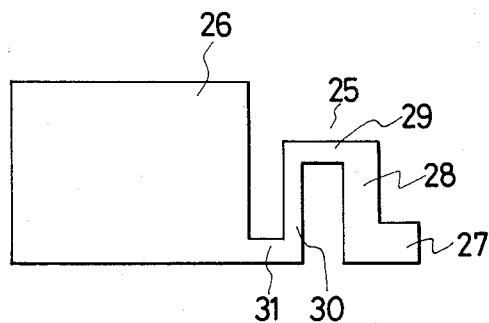

FIG. 10 shows one-fourth of FIG. 8 taking the symmetry into account. FIG. 10(a) is a little expended view so as to show the condition of the resonator without vibration easily to be understood (provided that the dimensional ratio is arbitrary chosen). FIGS. 10(a), 10(b) and 10(c) are expanded so that the distribution of displacement obtained by the vibration analysis of the long side vibration and the short side vibration by the Finite Element Method easily to be understood. (two dot chain line shows the reformed view and the solid line show the original view) According to the drawings, the long side vibration and the short side vibration at the vibrating portion 26 are not disturbed respectively, the other word, the long side and the short side freely vibrate. Though the resilient portions 30 interlock with the vibration of the vibrating portion 26 and considerably reformed, the displacement at the attenuation portions 28 is exceedingly small and the amount of displacement is minimum at the fixing portions 27.

Thus, the contour vibration mode quartz resonator provided with the supporting portion according to the present invention is effective since the disorder of vibration mode at the vibrating portion and leakage of vibration to the supporting member and the like become considerably small.

By the theoretical calculation the short side vibration (in the direction of the X'-axis) results in the excellent frequency-temperature characteristic than the long side vibration (in the direction of the Z''''-axis). Accordingly, it is better to provide the supporting portions 25 at the short side of the vibrating portion 26 than at the long side thereof. Namely, it is better not to provide the supporting portions at the long side which restrain the short side vibration.

If the analysis of vibration by the Finite Element Method is advanced more, it is found that the longitudinal direction of the supporting portions 25 in FIG. 8 are substantially parallel to the short side of the resonator. The data is advantageous since excessive space is not necessary in case the supporting portions are provided on the short side as mentioned above.

Examining the optimum shape of the resonator by Finite Element Method analysis, the disorder of vibration mode of the vibrating portion and the leakage of vibration (caused by the vibration at the fixing portions) are prevented if the following relations of each of the dimensions W0, W1, W2, W3, L1 and the like in FIG. 9 are satisfied. Namely, when each of the dimensions are changed by Finite Element Method, the mode of the vibrating portion and the vibrating condition of the supporting portion are examined as follows.

(1) If the relation between the width of the vibrating portion W and the width of the bridge portions W0 are represented by $0.015 \leq (W0/W) \leq 0.200$, the shape of the supporting portions enough to prevent the disorder of mode of vibration of the vibrating portion and the increase in distortion of the bridge portions are found.

(2) If the width of the resilient portion W1, the width of the attenuation portions W2 and the width between the resilient portions and the attenuation portions W3 satisfy the following equations:

$$0.3 \leq (W1/W2) \leq 1.2, \quad W1 \leq 1.5 \cdot W0,$$
$$0.2 \leq (W1/W3) \leq 2.0$$

when $0.015 \leq W0/W \leq 0.200$, the disorder of mode of the vibrating portion and the leakage of vibration are prevented well enough. Speaking the leakage of vibration detailedly, the amount of the maximum displacement at the vibrating portion is 1.0, the displacement of the fixing portion is less than $1 \times 10^{-3}$. (In this case, according to the calculation, the difference of frequency between the fixing portion being fixed and the fixing portion being free is substantially within 1 PPM). That is to say, the displacement of the fixing portion is almost zero by combining W1, W2, W3, W0 and L1 suitably and as a result the leakage of vibration to the supporting member and the the like is prevented.

Figure 1:
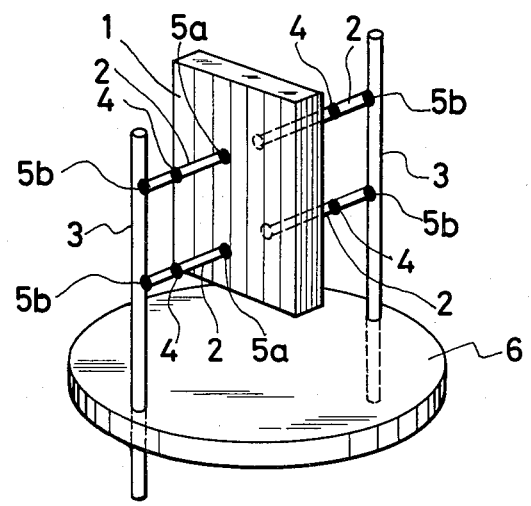
FIGS. 1 and 2 show the supporting wire method to support to conventional GT-cut quartz resonator.

(3) If the relation between the length L1 (the attenuation portions are the same dimension in FIG. 8 and W1 of the resilient portion is $5 \leq (L1/W1) \leq 25$, it is effective to prevent the disorder of vibration mode at the vibrating portion besides the relation in FIG. 1.

(4) It is effective to prevent the leakage of vibration that the fixing portion is at the center of the attenuation portion taking the symmetry of the resonator into account.

Applying the above mentioned results to FIG. 8, the excellent resonator without disorder of the intended vibration mode of the vibrating portion and leakage of vibration is realized. In the case that the short side width W of the vibrating portion is less than 5 mm, the sufficient characteristic is realized by the small supporting portions. Futher the resonator is freely designed with full of variety with the desired size.

FIG. 11 shows other embodiments of the shapes of the supporting portion of the contour vibration mode miniature quartz resonator according to the present invention. In the drawings, the supporting portion 25 made in one piece with the vibrating portion 26 by way of the bridge portion 31 consists of the resilient portion 30, the connecting portion 29, the attenuation portion 28 and the fixing portion 27. Each of the parameters ψ, θ, r and the plate thickness have values within the scope of the present invention.

FIG. 11(a) shows an embodiment in case the supporting portion 25 is only one side, FIG. 11(b) shows an embodiment in case the resilient portion 30 and the attenuation portion 28 are connected by one connecting portion 29, FIG. 11(c) shows an embodiment provided with three connecting portions and FIG. 11(d) shows in case the fixing portion 27 and the attenuation portion 28 made in one piece. Though the shapes of the supporting portion are changed, the primary object of the present invention is achieved if each of the conditions of the present invention are satisfied.

FIG. 12 shows an embodiment of the contour vibration mode quartz resonator according to another invention. FIG. 13 shows A—A sectional view of FIG. 12. Each of the conditions of the vibrating portion 26 and the supporting portions 25 of the resonator 21 are omitted in the drawings since the conditions are already illustrated in FIGS. 4 to 11. A metal electrode film 22 such as Au and the like is disposed on both major surfaces of the resonator 21, and the film is disposed on both surfaces of the vibrating portion 26 and the supporting portions 25. Electrode films 33a on the obverse surface of the vibrating portion 26 and one of the supporting portions 25 are connected by way of the one bridge portion 31, and electrode films 33b on the reverse surface of the vibrating portion 26 and the other of the supporting portions 25 are connected by way of the other bridge portion 31.

In the above mentioned construction, the fixing portions 27 of the resonator are mechanically and electronically connected simultaneously to the lead terminal and the supporting member (not shown) which electrically conduct to the external circuit (the oscillating circuit) by sealing materials such as solder or the like, whereby the excellent working property and the high mass productivity are realized. In order to make sure the reliability of the mounting process, the metal electrode films 33a and 33b disposed on both surfaces of the resonator are electrically connected to metals 34a and 34b such as Au and the like disposed on a certain portion of the supporting portions (whole surfaces of the supporting portions may as well) taking advantage of the characteristic of the metal powder to be spattered on the supporting portions in a circular motion as shown in FIG. 14.

The distribution of displacement in the long side direction (Z''-direction) of the resonator according to the present invention is sought by the analysis of Finit Element Method in the same way as FIG. 10. FIG. 15 is the analyzed result of distribution of displacement showing ¼ of resonator represented by the relative displacement when the maximum displacement is 1.0. According to the drawing, the displacement of the vibrating portion 26 draws substantially a sine curve and A portion near the bridge portions 31 is distorted and the abrupt change of the distortion is observed. In order to prevent the effects by the distortion, the electrode film is removed near the bridge portion as shown in FIG. 16, or the thickness of the electrode film is increased near the bridge portion as shown in FIG. 17.

In FIG. 16, the electrode film 33 disposed on the vibrating portion 26 is removed at portions 36 in the vicinity of the bridge portions 31 to thereby prevent the effect of electric polarization caused by abnormal distortion.

In FIG. 17, the electrode film 33 disposed on the vibrating portion 26 and the supporting portions 25 is thicker at portions 37 in the vicinity of the bridge portions 31 to thereby prevent the distortion. By the method mentioned above, the effect by distortion illustrated in FIG. 15 is prevented.

It is to be noted that the shape and dimension of the supporting portion is not limited to the quartz resonator mentioned above and applied to the other contour vibration mode piezo electric resonatr.

The present invention have been illustrated in conjunction with the drawings. Referring then to the experimental result.

FIGS. 18 and 19 are general views of the resonator according to the present invention, and FIG. 20 and Table 2 show each of the characteristics.

In FIGS. 18 and 19 the resonator has each of the parameters $\psi=56$, $\theta=45°$ and $r=0.88$ and the short side W and the thickness are respectively about 1.4 mm and 80 μm.

Each of the dimensions illustrated by FIG. 9 are shown in Table 1.

The resonator case is composed of three layers of plates 40, 41 and 42 in FIGS. 18 and 19. The plate 40 at the middle layer and the plate 42 at the upper layer are provided with holes of suitable size to thereby provide a void portion inside the capsule and a stepped portion to support the resonator 21 is made by the plates 40 and 42. And the fixing portion 27 of the resonator 21 is directly fixed to the stepped portion. Then the electrode lead films 38a and 38b such as Au and the like are disposed on the surface of the stepped portion where the resonator is supported and fixed by evaporation, printing and the like and the electrode lead films 38a and 38b are lead to a part of the lower surface of the plate 41 by way of the external side surfaces of the plates 40 and 41. The resonator 21 is set on the plate 40 so that the fixing portion 27 of the resonator contacts the Au films 38a and 38b disposed on the plate 40 and fixed by the electro-conductive sealing materials 47a and 47b such as solder and the like and at the same time electrically connected with the exciting electrode films 33a and 33b disposed on both sides of the resonator 21. As clearly understood from FIG. 19, the electrode lead films 38a and 38b are electrically connected with the exciting electrode film 33a disposed on the obverse surface of the resonator 26 and the exciting electrode film 33b disposed on the reverse surface of the resonator 26 respectively. When the alternalte voltage that the Au films 38a and 38b are different polarity each other is applied to the Au films 38a and 38b, the electric field in the direction of the plate thickness is applied to the vibrating portion of the resonator 21, whereby the resonator 21 vibrates. The vibration characteristic of the resonator unit measured by the transmission method are and shown in Table 2 the frequency-temperature characteristics thereof are shown in FIG. 20.

In Table 2, R0 is an equivalent series resistance, C0 is an equivalent inductance and the number of resonator experimented is 10 pieces. As clearly understood by the result of experiment, each of the characteristics and the supporting structure are very excellent even though the resonator is very miniature size in comparison with the conventional type.

TABLE 1

|  | dimension (mm) |
|---|---|
| W | 1.6 |
| L | 1.41 |
| $W_0$ | 0.12 |
| $W_1$ | 0.08 |
| $W_2$ | 0.10 |
| $W_3$ | 0.08 |
| $L_1$ | 0.92 |

TABLE 2

|  | (KHz) frequency | (Ω) $R_0$ | (H) $L_0$ | (fF) $C_0$ |
|---|---|---|---|---|
| $\bar{x}$ | 2,265 | 80 | 1.76 | 2.80 |
| $\sigma$ |  | 25 | 0.01 | 0.02 |

By way of another embodiment guide members 50 are provided at the ends of the fixing portions 27 as shown in FIG. 21. A detailed explanation of FIG. 21 is omitted since the portions other than the guide members are the same as FIGS. 18 and 19. The guide members 50 are made in one piece with the fixing portions 27 and guided into the inner diameter of the hole of the ceramic plate 42 and the fixing portions are automatically positioned by the guide members 50 when the resonator is placed. Since the fixing portions of the supporting portions according to the present invention scarcely displace, the guide members do not badly influence on the characteristics of the resonator. If necessary, the guide members 50 may removed from the fixing portions by notching necked portions 51 of the fixing portions 27 after the fixing portions 47 are fixed by the solders 47a and 47b. Since the resonator is set easily with the aid of the guide portions in comparison with the resonator shown in FIGS. 18 and 19, automation of the processing of the resonator become easy.

Figure 22:
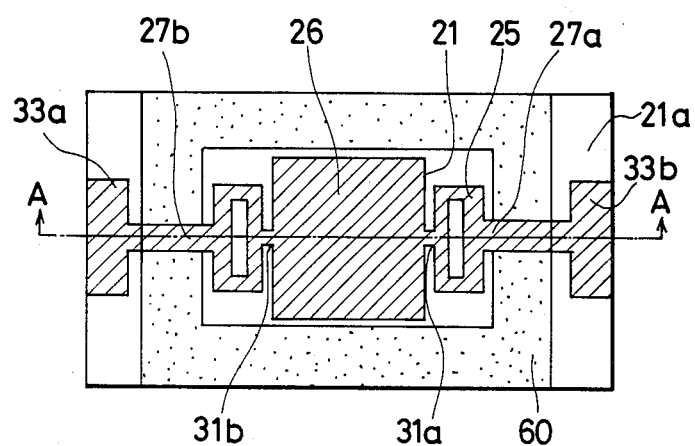
FIGS. 22 and 23 are a plan view and a sectional view showing an embodiment of the piezo electric resonator.
Figure 23:
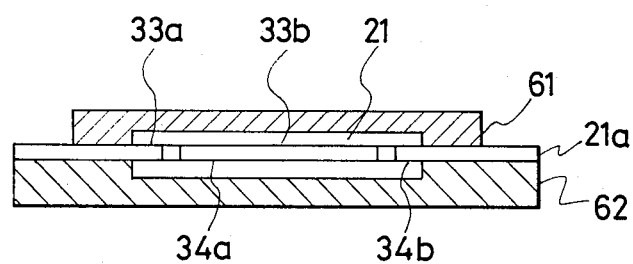

FIGS. 22 and 23 show another embodiments of the present invention, wherein the supporting member is of the piezo electric material same as the resonator. FIG. 22 shows a plan view and FIG. 23 shows the A-A' cross section of FIG. 10a. The vibrating portion 26 and the supporting portions 25 are made in one piece by way of the bridge portions 31a and 31b with the predetermined cut angle and dimensions. Further the fixing portions 27 of the supporting portions 25 are provided with frame portions 21a of the predetermined width dimension surrounding the resonator 21, and Au film 60 is disposed on both sides of the frame 21a about 2 μm in thickness. A base 62 is made of the same piezo electric material as the resonator 21. And Au film (not shown) disposed on the obverse surface of the base 62 and Au film (not shown) disposed on the reverse surface of the frame portion 21 are adhered by way of the solder and the like to thereby fix and seal the base 62 and the resonator 21. Further a cap 61 is made of the same piezo electric material as the resonator and on which Au film (not shown) disposed and adhered with corresponding Au film 60 disposed on the frame portion 21a by way of solder and the like. The exciting electrodes 33a and 33b disposed on the major surface of the resonator 21 are lead out and protrudes from the frame portion 21a fixing the cap 61 on the frame portion 21a as it is. The cap 61 for vacuum sealing is omitted in FIG. 22. On the cap 61 and the base 62 are disposed a very small amount of half etchings respectively to thereby form a void portion to seal the resonator 21. In order to be understood the embodiment more detail the assembling process of the resonator will be illustrated in conjunction with the assembling process of the resonator shown in FIGS. 24, 25 and 26. Three layers of the piezo electric plates respectively shown in FIGS. 24, 25 and 26 are treated by batch process by photo lithographic technique. FIG. 25 shows a number of piezo electric plates 62 lying in a row by way of connecting portions 75 provided all at once on a frame 74 by way of the photo technique and the etching technique from a piezo electric plate wafer 73. Thereafter 63a portions are half etched for several to several tens $\mu$ in depth and Au films 60b are disposed around the 63a portions by evaporation. Subsequently the vibrating portion 26, the supporting portions 25 and the frame 21a formed in one body as shown in FIG. 24 lies in a row with the frame 71 by way of the connecting portion 75 is provided from the piezo electric plate wafer 70 by way of the above mentioned techniques. And then the electrode films 33a and 33b for vibration and extraction and the Au film 60a are disposed on the resonator by spattering and evaporation.

After the above mentioned process a cap 61 fabricated from a piezo electric plate wafer 76 shown in FIG. 26 is connected with a frame 77 by a frame 77 by way of a connecting portion 78 and 63b portion of several to several tens $\mu$ in depth and Au film 60c are disposed on one side of the cap 61 by half etching. The three piezo electric plates laid to overlap one another is as shown in FIGS. 22 and 23. And by applying heat and pressure to Au films 60a, 60b and 60c disposed on the respective piezo electric plates laid to overlap one another by way of solders, three layers of piezo electric plates are simultaneously sealed. And then three layers of piezo electric plates are separated respectively by breaking the connecting portions 72, 75 and 78 with a weak strength at the final process.

Thus the embodiments shown in FIGS. 22, 23, 24, 25 and 26 are effective to permit the mass production and cost down since the assembling process of the resonator is not only omitted but also a number of the cases and the resonators can be made simultaneously in the same process.

Further, since both ends of the resonator is supported the flexure caused by shock is small and the space in the case is scarcely necessary, moreover, since the resonator is not necessarily set on the frame the space in the width direction (the space between the resonator and the inner wall of the case) can be very small, and thereby the resonator are considerably miniturized.

Referring next to FIG. 12 showing an embodiment of the resonator mounted on the supporting member such as plate spring having elasticity.

The thickness of the resonator should be reduced since it is made by photo lithographic technique, however, there is a fear that the resonator is broken or the frequency changes in a large scale by the shock when the resonator is mounted on the elastic material by the bending power applied to the resonator when the flexibility of the elastic material at both ends of the resonator is different. Another embodiment shown in FIG. 27 aims to eliminate the above mentioned disadvantages, wherein the flexibility of the supporting material at both ends of the resonator is almost equal constantly. The exciting electrodes are omitted in FIG. 27 for simplification. The resonator 21 is enclosed by the step filling a copper glass 82 for sealing into a cylindrical base 81 made of copper, perforating plate lead terminals 83a, 83b made of copper material through the cylindrical base 81 provided with the lead terminals 83a, 83b into a cylindrical cap 80 made of nickel silver by pressure. The resonator 21 is fixed to the lead terminals 83a and 83b by electro conductive sealing material 84a, 84b such as a solder at fixing portions 27a, 27b provided at the end of supporting portions 25a and 25b.

The explanation of the connection between the lead terminals 83a, 83b, electrically conduct with the exciting electrode of the resonator 21 and the external circuit, and said exciting electrode is omitted since the principle is the same as the embodiments shown in 18, 19, 22 and 23.

Figure 27:
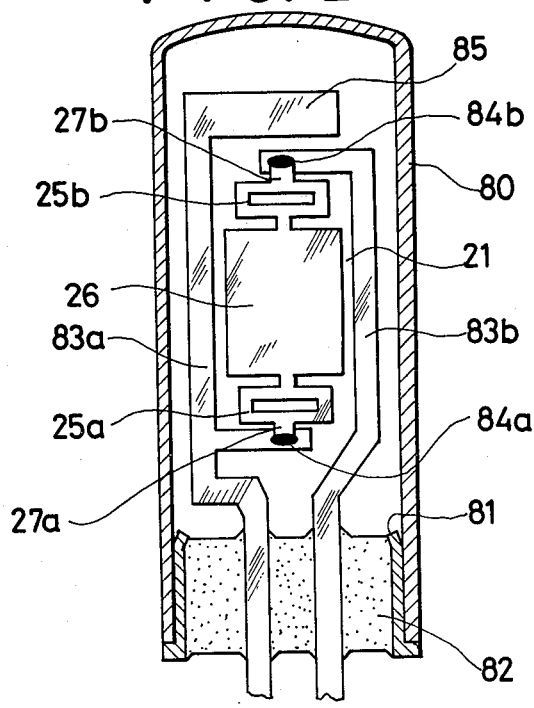
FIG. 27 is a sectional view showing the piezo electric resonator and the supporting method thereof according to the present invention.
Figure 28:
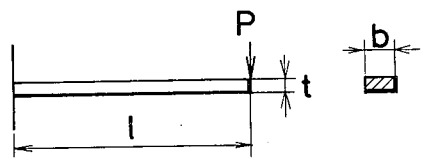
FIGS. 28 and 29 show the principle of the supporting structure according to the present invention.
Figure 29:
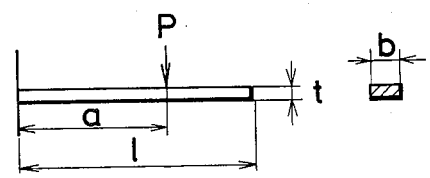

Each of the lead terminals are designed so that the flexibility of the lead terminal 83a at the fixing point of the fixing portion 27a and the flexibility of the lead terminal 83b at the fixing point of the fixing portion 27b are substantially equal. A portion 85 at the end of the lead terminal 83a is provided so as to adjust the flexibility. Now the flexibility of the lead terminals will be examined. In the case that the lead terminal is regarded as a cantilever to which a load is mounted on the end thereof, the flexibility y1 of the end of the lever is represented (using marks in FIG. 28) as follows.

$$y1 = \frac{P}{3EI} l^3 \qquad (1)$$

$$= \frac{Pl^3}{3E} \cdot \frac{12}{bt^3} = \left(\frac{4P}{E}\right) \cdot \left[\frac{1}{b}\left(\frac{l}{t}\right)^3\right]$$

where E is Young's modulus and P is a concentrated load. Accordingly the flexibility of the end of the cantilever is adjusted by changing the length l, the width b and the thickness t. The equation (1) teaches that the simplest method to adjust the flexibility of the load terminal is to change the value of l/t. Further, in the case that a load is mounted on the middle of the lever, the flexibility y2 of the end of the lever is represented as follows.

$$y2 = \frac{Pa^2}{6EI}(3l - a) \qquad (2)$$

$$= \frac{P}{6E} a^2 \cdot (3l - a) \cdot \frac{12}{bt^3}$$

$$= \left(\frac{2P}{E}\right) \cdot \left[\frac{1}{bt^3} \cdot a^2(3l - a)\right]$$

provided that a is the length from the supporting point to the loaded point from FIG. 29. y2 changes variously by the loaded position and the dimentsion of the lever. P in equations (1) and (2) can be changed by adding the additional load (85) as shown in FIG. 27. Thus there are various methods to change the flexibility though not referred now. By the above mentioned examinations, the following methods are applied for the lead terminal by way of the embodiments of the present invention, namely the method to add the additional load as shown in FIG. 12, the method to change the dimension of the lead terminal, the method to equalize the length from the copper glass to the fixing portion and each of the dimensions.

The present invention have been illustrated so far in conjunction with the embodiments. The feature of the present invention is summalized as follows:

(1) The resonator having excellent and stable characteristics (dispersion is small) is realized since the supporting structure makes the energy loss against the contour vibration mode piezo electric resonator at minimum.

(2) The shock resistance is exceedingly excellent since the resonator is rigidly supported because of small energy loss.

(3) The resonator of small energy loss is realised even if the supporting portions are small. Since the supporting portions are provided at the short sides of the vibrating portion, the resonator is easily miniaturized.

(4) As clearly understood by (1) and (2), the assembly of the resonator is easy and the mass production is possible.

(5) The design of the resonator is full of variaty by combining the parameters of the supporting portion in the range of each of the dimensions.

(6) The quartz resonator of desired characteristics is realized since the degree of freedom of the cut angle and the dimentional ratio is large.

(7) The resonator having the excellent frequency-temperature characteristics is realized by suitably combining the cut angle and the dimensional ratio after the shape and the dimention of the supporting portion are decided.

(8) The disorder of mode of the vibrating portion produced when the supporting portion and the vibrating portion are made in one piece is easily removed by changing the electrode composition as necessary.

(9) When the two supporting portions are provided at both ends of the vibrating portions the amount of flexure caused by shock is small and the case of the resonator can be exceedingly small size by the reason mentioned in (3).

As mentioned above the present invention is very advantageous in the industrial view point.

I claim:

1. A contour vibration mode piezoelectric resonator comprising: a vibrating portion having opposed relatively short sides and opposed relatively long sides, at least one supporting portion, and at least one bridge portion connecting the vibrating and supporting portions; said vibrating, supporting and bridge portions all being integrally formed as a single piece; wherein the supporting portion comprises a resilient portion connected to substantially the center of one short side of the vibrating portion through said bridge portion, an attenuation portion connected to said resilient portion, and a fixing portion connected to or forming a part of the attenuation portion; and wherein the relationship between the width W of the short side of the vibrating portion, the width $W_0$ of the bridge portion, and the length $L_1$ and the width $W_1$ of the resilient portion is represented by:

$$0.015 \leq (W_0/W) \leq 0.200, \text{ and}$$

$$5 \leq (L_1/W_1) \leq 25.$$

2. A contour vibration mode piezoelectric resonator as claimed in claim 1; wherein the resonator is made by etching.

3. A contour vibration mode piezoelectric resonator as claimed in claim 1; wherein the bridge portion is disposed at substantially the center of the resilient portion of the supporting portion.

4. A contour vibration mode piezoelectric resonator as claimed in claim 1; including supporting portions disposed at each of the short sides of the vibrating portion and connected thereto through respective bridge portions.

5. A contour vibration mode piezoelectric resonator as claimed in claim 1; wherein the supporting portion has an opening therethrough which is surrounded by and defined by the connected together resilient and attenuation portions.

6. A contour vibration mode piezoelectric resonator as claimed in claim 1; wherein the resilient portion extends substanially in parallel with the short sides of the vibrating portion.

7. A contour vibration mode piezoelectric resonator as claimed in claim 1; wherein at least a part of the attenuation portion extends substantially in parallel with the resilient portion.

8. A contour vibration mode piezoelectric resonator as claimed in claim 1; wherein the relationship between the width $W_1$ of the resilient portion and the width $W_2$ of the attenuation portion and the space $W_3$ between the resilient portion and the attenuation portion is represented by:

$$0.3 \leq (W_1/W_2) \leq 1.2,$$

$$W_1 \leq 1.5 \times W_0, \text{ and}$$

$$0.2 \leq (W_1/W_3) \leq 2.0.$$

9. A contour vibration mode piezoelectric resonator as claimed in claim 1; wherein the relationship between the long side L and the short side W of the vibrating portion is represented by:

$$0.8 \leq (W/L) < 1.0.$$

10. A contour vibration mode piezoelectric resonator as claimed in claim 1; wherein the piezoelectric resonator comprises a quartz crystal Y plate rotated around the x axis through an angle of 45° to 65°, and the Y plate being further rotated through an angle of ±(40° to 50°) inside the major surfaces thereof.

11. A contour vibration mode piezoelectric resonator as claimed in claim 1; including metallic electrode films disposed on each of the opposite major surfaces of the vibrating and supporting portions and on part of the surface of the bridge portion.

12. A contour vibration mode piezoelectric resonator as claimed in claim 11; wherein the metallic electrode film in the vicinity of the bridge portion is thicker than at the other portions.

13. A contour vibration mode piezoelectric resonator as claimed in claim 11; wherein at least part of the bridge portion is free of the metallic electrode film.

14. A contour vibration mode piezoelectric resonator as claimed in claim 1; further comprising a case; a supporting member mounted within the case and having an electrode pattern formed thereon; and means fixedly connecting the fixing portion of the supporting portion to the supporting member and electrically connecting the fixing portion to the electrode pattern.

15. A contour vibration mode piezoelectric resonator comprising: a vibrating portion having opposed relatively short sides and opposed relatively long sides, two supporting portions, and two bridge portions connecting the two supporting portions to the centers of respective ones of the short sides of said vibrating portion; said vibrating, supporting and bridge portions all being integrally formed as a single piece; wherein each of the two supporting portions comprises a resilient portion extending parallel to the short sides of the vibrating portion, an attenuation portion, connecting portions connecting the ends of the resilient portion to the ends of the attenuation portion, and a fixing portion connected to or forming a part of the attenuation portion, and wherein the connected together resilient and attenuation portions define a generally rectangular opening which is surrounded by the connected together resilient, connecting and attenuation portions.

16. A contour vibration mode piezoelectric resonator as claimed in claim 15; wherein the resonator is made by etching.

17. A contour vibration mode piezoelectric resonator comprising: a single piece of piezoelectric material having a vibratory portion, a bridge portion and a supporting portion, said vibratory portion having a pair of opposite major surfaces bounded by a pair of opposed relatively short side surfaces and a pair of opposed relatively long side surfaces, said supporting portion having an elongate resilient portion spaced from and extending in the same general direction as one of the short side surfaces, an elongate attenuation portion spaced from and extending in the same general direction as said resilient portion and connecting portions connecting the ends of the resilient portion to the ends of the attenuation portion, and said bridge portion being connected at one end to substantially the center of one of the short side surfaces and being connected at its other end to substantially the center of the resilient portion of said supporting portion.

18. A contour vibration mode piezoelectric resonator according to claim 17; wherein the supporting portion is configured such that a through opening exists between the resilient and attenuation portions.

19. A contour vibration mode piezoelectric resonator according to claim 17; further including another bridge portion and supporting portion alike those defined in claim 17 connected to the other of the short side surfaces of the vibratory portion.

20. A contour vibration mode piezoelectric resonator according to claim 17 or 19; wherein the relationship between the width W of the short side of the vibrating portion, the width $W_0$ of the bridge portion, and the length $L_1$ and the width $W_1$ of the resilient portion is represented by:

$$0.015 \leq (W_0/W) \leq 0.200, \text{ and}$$
$$5 \leq (L_1/W_1) \leq 25.$$

21. A contour vibration mode piezoelectric resonator according to claim 17 or 19; wherein the piezoelectric resonator comprises an etched piece of piezoelectric material.

22. A contour vibration mode piezoelectric resonator according to claim 17 or 19; further including metallic electrode films disposed on the opposite major surfaces of said vibratory, bridge and supporting portions, and wherein the metallic electrode films in the region of the bridge portion is thicker than at the other portions.

23. A contour vibration mode piezoelectric resonator according to claim 17 or 19; further including metallic electrode films disposed on the opposite major surfaces of said vibratory, bridge and supporting portions, and at least a part of the opposite major surfaces of the bridge portion being free of any metallic electrode film.

24. A contour vibration mode piezoelectric resonator according to claim 17 or 19; wherein the single piece of piezoelectric material comprises a GT cut quartz crystal plate.

* * * * *